(12) United States Patent
Huang et al.

(10) Patent No.: US 12,362,308 B2
(45) Date of Patent: Jul. 15, 2025

(54) ELECTRONIC DEVICE

(71) Applicant: Innolux Corporation, Miao-Li County (TW)

(72) Inventors: Hao Jung Huang, Miao-Li County (TW); Chia Chun Liu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 657 days.

(21) Appl. No.: 17/411,040

(22) Filed: Aug. 24, 2021

(65) Prior Publication Data

US 2022/0093551 A1   Mar. 24, 2022

Related U.S. Application Data

(60) Provisional application No. 63/081,916, filed on Sep. 23, 2020.

(30) Foreign Application Priority Data

Feb. 18, 2021  (CN) ......................... 202110187554.7

(51) Int. Cl.
*H01L 23/00*   (2006.01)
*H01L 23/498*   (2006.01)
(Continued)

(52) U.S. Cl.
CPC ........ *H01L 24/24* (2013.01); *H01L 23/49822* (2013.01); *H01L 24/05* (2013.01);
(Continued)

(58) Field of Classification Search
CPC ...... H05K 1/116; H05K 1/115; H05K 3/4038; H05K 2201/09563; H05K 2201/10106; H05K 2201/10121; H01L 25/167; H01L 27/1463; H01L 27/14643–14645; H01L 27/14605; H01L 27/14607; H01L 27/14612–14616; H01L 25/0657; H01L 25/0652; H01L 25/043; H01L 25/071; H01L 25/074; H01L 25/0756;
(Continued)

(56) References Cited

U.S. PATENT DOCUMENTS 4,851,614 A    7/1989  Duncan, Jr.
2001/0038905 A1*  11/2001  Takada .................... H01L 24/32
                                                  428/209

(Continued)

OTHER PUBLICATIONS

"Search Report of Europe Counterpart Application", issued on Feb. 22, 2022, p. 1-p. 9.

*Primary Examiner* — Younes Boulghassoul
*Assistant Examiner* — Quinton A Brasfield
(74) *Attorney, Agent, or Firm* — JCIPRNET

(57) ABSTRACT

An electronic device including a first conductive element, a second conductive element, a substrate, and a conductor is provided. The first conductive element has a first region. The substrate has a through hole. The first through hole is disposed between the first conductive element and the second conductive element. The conductor electrically connects the first conductive element to the second conductive element through the through hole. The through hole is partially surrounded by the first region.

19 Claims, 8 Drawing Sheets

(51) Int. Cl.
*H01L 25/16* (2023.01)
*H10D 86/40* (2025.01)
*H10D 86/60* (2025.01)

(52) U.S. Cl.
CPC ............ *H01L 24/73* (2013.01); *H01L 25/167* (2013.01); *H01L 24/32* (2013.01); *H01L 2224/05551* (2013.01); *H01L 2224/05555* (2013.01); *H01L 2224/24105* (2013.01); *H01L 2224/24226* (2013.01); *H01L 2224/32225* (2013.01); *H01L 2224/73267* (2013.01); *H10D 86/411* (2025.01); *H10D 86/60* (2025.01)

(58) Field of Classification Search
CPC ................. H01L 25/112; H01L 25/117; H01L 2224/08145; H01L 27/0688; H01L 23/49827; H01L 23/5384; H01L 23/481; H01L 29/4175; H01L 2225/06541–06544; H01L 2225/06548; H01L 21/76898; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 21/486; H04N 25/79

See application file for complete search history.

(56) References Cited

U.S. PATENT DOCUMENTS

| | | | |
|---|---|---|---|
| 2004/0231886 A1* | 11/2004 | Boggs | H05K 3/3436 |
| | | | 174/262 |
| 2013/0140072 A1* | 6/2013 | Wu | H05K 1/0259 |
| | | | 174/262 |
| 2018/0254226 A1 | 9/2018 | Iguchi | |
| 2020/0388636 A1* | 12/2020 | Yueh | H01L 25/0655 |
| 2021/0175381 A1* | 6/2021 | Li | H10K 59/121 |
| 2021/0265546 A1* | 8/2021 | Li | H01L 25/167 |

\* cited by examiner

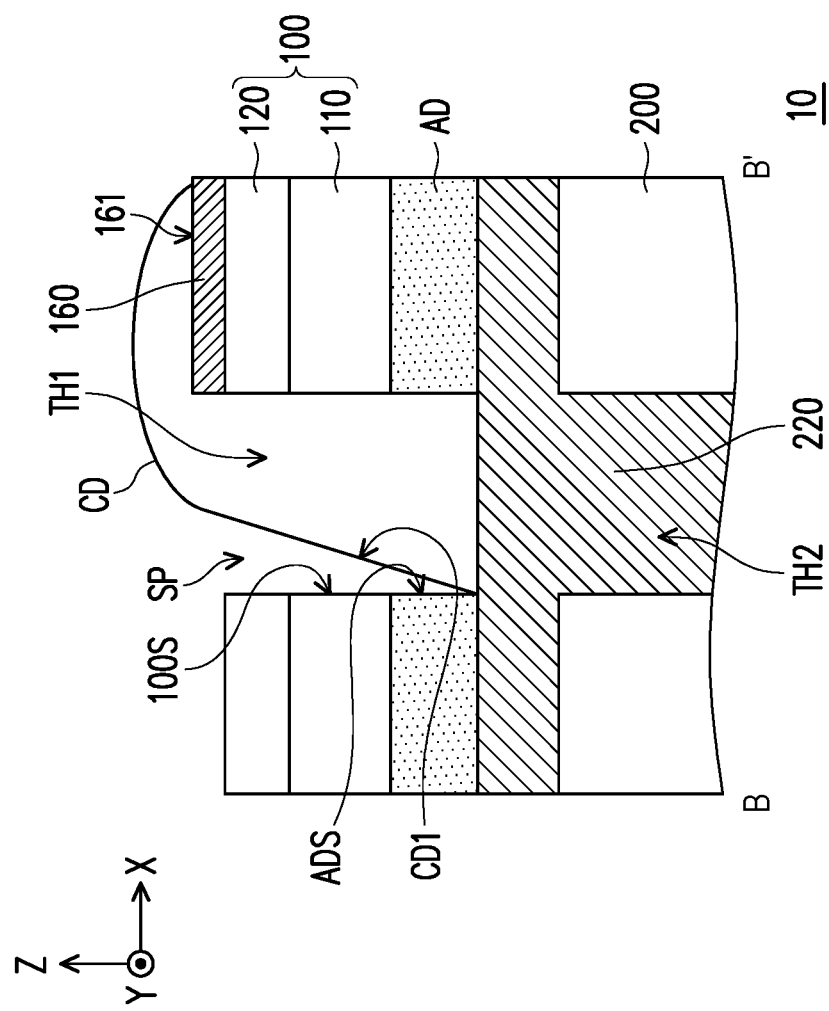
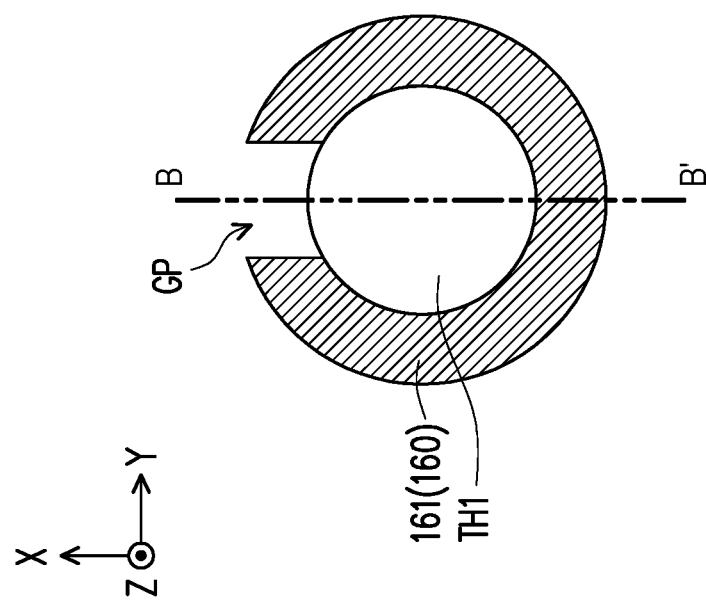
FIG. 3B
FIG. 3A

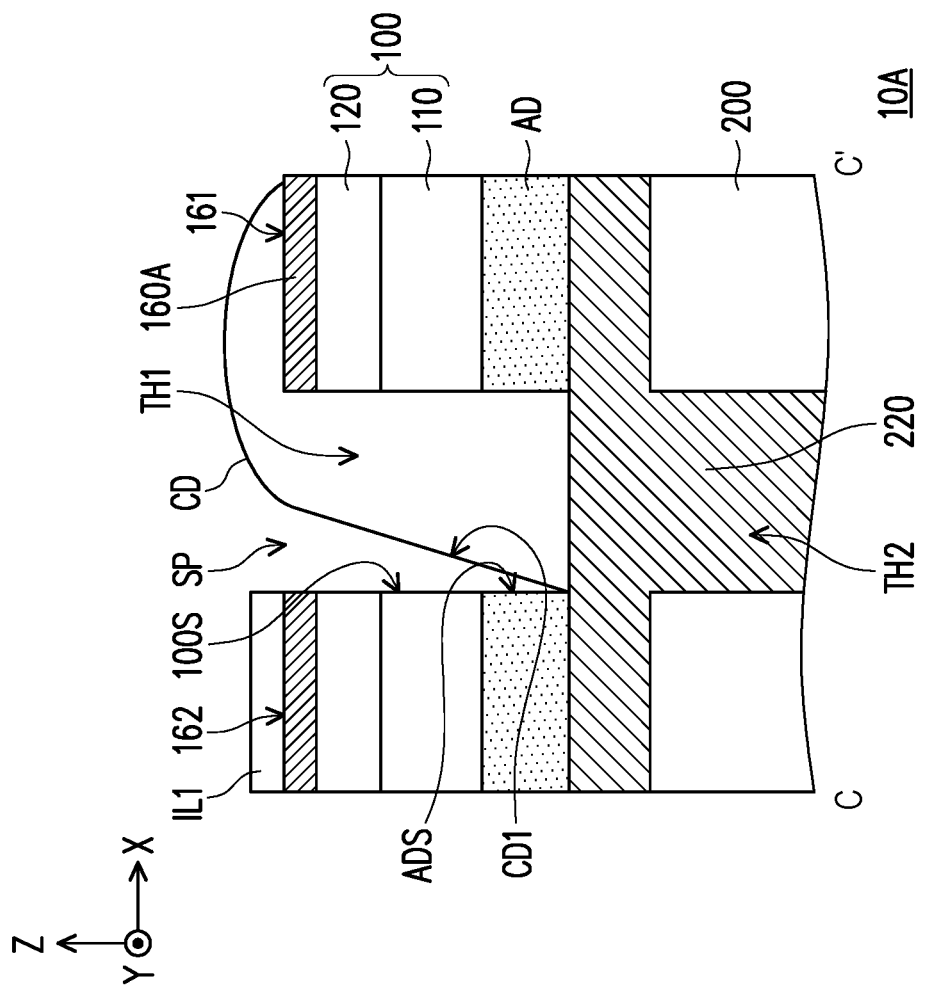
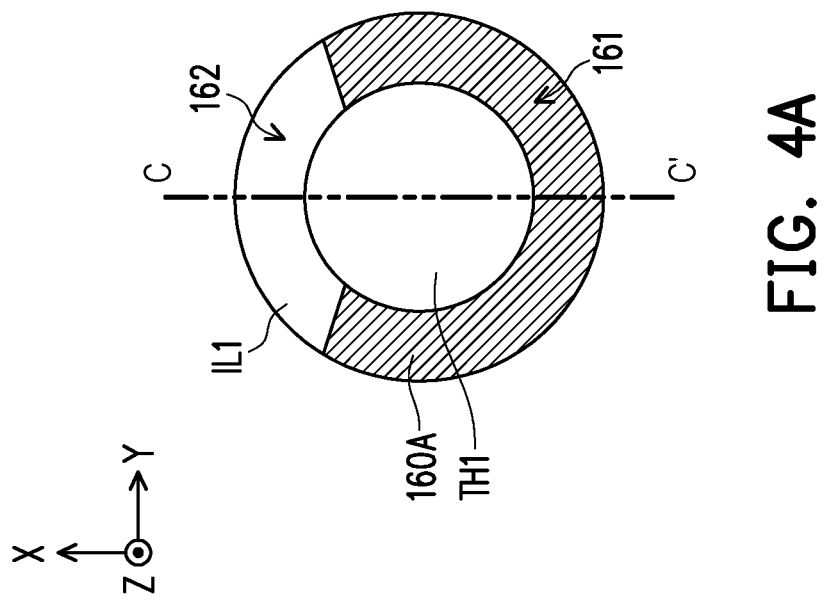
FIG. 4B
FIG. 4A

ELECTRONIC DEVICE

CROSS-REFERENCE TO RELATED APPLICATION

This application claims the priority benefit of U.S. provisional application No. 63/081,916, filed on Sep. 23, 2020 and China application serial no. 202110187554.7, filed on Feb. 18, 2021. The entirety of each of the above-mentioned patent applications is hereby incorporated by reference herein and made a part of this specification.

BACKGROUND

Technical Field

The disclosure relates to an electronic device, and in particular, relates to an electronic device including a conductive element.

Description of Related Art

As the applications of electronic devices continue to rise, the development of display technology is changing with each passing day as well. Regarding the applications of electronic devices and the habits or needs of users, as the requirements for the structure and quality of the electronic devices grow higher, and the electronic devices are faced with different problems. Therefore, the research and development of electronic devices are required to be continuously updated and adjusted.

SUMMARY

The disclosure provides an electronic device exhibiting good electrical quality or display quality.

According to an embodiment of the disclosure, an electronic device includes a first conductive element, a second conductive element, a substrate, and a conductor. The first conductive element has a first region. The substrate has a through hole. The first through hole is disposed between the first conductive element and the second conductive element. The conductor electrically connects the first conductive element to the second conductive element through the through hole. The through hole is partially surrounded by the first region.

To sum up, in the electronic device provided in an embodiment of the disclosure, since the through hole is partially surrounded by the first region of the first conductive element, in the step of forming the conductor, the conductor only fills a portion of the through hole. The side wall of the conductor in the through hole and the side wall of the through hole is separated by the space. The side wall of the conductor does not contact the side wall of the through hole. In this way, during the step of forming the conductor, the generated air bubbles may be released through the space. Accordingly, the risk of generation of air bubbles in the conductor, which may lead to poor contact between the conductor and the second conductive element and the problem of electrical abnormality, may be prevented from occurring. Therefore, reliability of electrical connection of the electronic device may be improved, and that the electronic device may exhibit good electrical quality or display quality. Further, the through hole may allow the electronic component to be disposed on the back side of the substrate, and in this way, the peripheral usage rate of the electronic device is lowered, the technical requirement of a narrow frame is further achieved, and good display quality is provided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A is a schematic enlargement top view of a first conductive element and a through hole of the electronic device according to an embodiment of the disclosure.

FIG. 3B is a schematic cross-sectional view of the electronic device of FIG. 3A taken along a cross-sectional line B-B'.

FIG. 4A is a schematic enlargement top view of a first conductive element and a through hole of an electronic device according to another embodiment of the disclosure.

FIG. 4B is a schematic cross-sectional view of the electronic device of FIG. 4A taken along a cross-sectional line C-C'.

DESCRIPTION OF THE EMBODIMENTS

Figure 1:
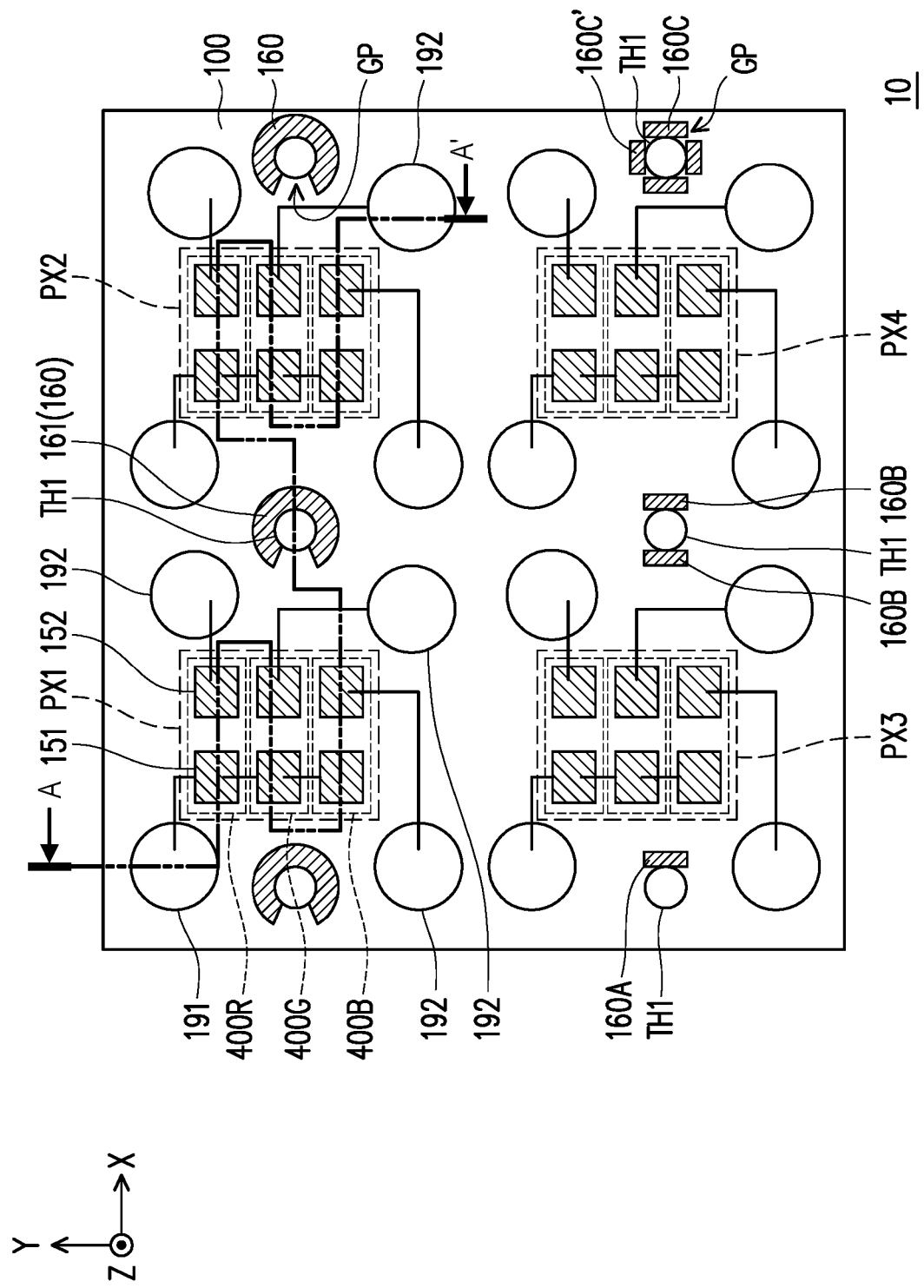
FIG. 1 is a schematic top view of an electronic device according to an embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device is depicted in the accompanying drawings of the disclosure, and specific elements in the drawings are not depicted according to actual scales. In addition, the numbers and sizes of the elements in each drawing are provided for illustration only and are not used to limit the scope of the disclosure.

Throughout the specification and appended claims of the disclosure, certain terms are used to refer to specific components. A person having ordinary skill in the art should understand that electronic apparatus manufacturers may refer to the same elements by different names. In the specification, it is not intended to distinguish between elements that have the same function but different names. In the following specification and claims, the words "including", "containing", and "having" are open-ended words and therefore should be interpreted as "containing but not limited to . . . ". Therefore, when the term "including", "containing", and "having" are used in the description of the disclosure, it specifies the existence of corresponding features, regions, steps, operations, and/or components, but does not exclude the existence of one or more corresponding features, regions, steps, operations, and/or components.

In the following embodiments, wording used to indicate directions, such as "up", "down", "front", "back", "left", and "right" merely refers to directions in the accompanying figures. Therefore, the directional wording is used to illustrate rather than limit the disclosure. In the accompanying drawings, common characteristics of the methods, structures, and/or materials used in specific embodiments are shown. However, the accompanying drawings should not be interpreted to define or limit the scopes or the properties of the descriptions in the embodiments. For instance, the relative size, thickness, and location of each film layer, region, and/or structure may be reduced or enlarged for clarity.

In the disclosure, the length and width may be measured by an optical microscope, and the thickness may be measured from a cross-sectional image in an electron microscope, but it is not limited thereto.

The terms "about", "equal to", "identical" or "same", "substantially", or "approximately" are generally interpreted as being within 20% of a given value or are interpreted as being within 10%, 5%, 3%, 2%, 1%, or 0.5% of a given value.

In the disclosure, if one structure (or layer, component, substrate) is described as being located on another structure (or layer, element, substrate), it can mean that the two structures are adjacent and are directly connected, or the two structures are adjacent to each other instead of being directly connected. Indirect connection means that at least one intermediary structure (or intermediary layer, intermediary component, intermediary substrate, intermediary interval) is provided between two structures, the lower side surface of one structure is adjacent to or is directly connected to the upper side surface of the intermediate structure, and the upper side surface of the other structure is adjacent to or is directly connected to the lower side surface of the intermediate structure. The intermediary structure may be formed by a single-layer or multi-layer physical structure or a non-physical structure, which is not particularly limited. In the disclosure, when a specific structure is disposed to be "on" another structure, it may mean that the specific structure is "directly" on another structure, or it may mean that the specific structure is "indirectly" on another structure. That is, at least one structure is provided between the specific structure and the another structure.

The terms "first", "second, etc. provided in the specification of the disclosure may be used to describe various elements, components, regions, layers, and/or portions in the specification, but these elements, components, regions, layers, and/or portions should not be limited by these terms. These terms are used to distinguish one element, component, region, layer, or portion from another element, component, region, layer, or portion. Therefore, the "first element", "component", "region", "layer", or "portion" discussed below may be referred to as being distinguished from the "second element", "component", "region", "layer", or "portion", but are not used to limit the sequence or specific elements, components, regions, layers, and/or portions. Further, the "first" element referred to in the paragraphs of the specification may be renamed the "second" element in the claims.

The electronic device may have a display function, and the electronic device provided by the embodiments of the disclosure may include a display device, an antenna device, a sensing device, a splicing device, or a transparent display device, but is not limited thereto. The electronic device may be a rollable, stretchable, bendable, or flexible electronic device. The electronic device may include, for example, liquid crystal, a light emitting diode (LED), other suitable materials which may be arbitrarily arranged and combined, other suitable display media, or a combination of the foregoing. The light emitting diode may include, but not limited to, an organic LED (OLED), a millimeter/sub-millimeter LED (mini LED), a micro LED, or a quantum dot (QD) LED (e.g., QLED and QDLED). The antenna device may be, for example, a liquid crystal antenna, but is not limited thereto. The splicing device may be, for example, a display splicing device or an antenna splicing device, but is not limited thereto. Note that the electronic device may be any combination of the foregoing, but is not limited thereto. Besides, the appearance of the electronic device may be rectangular, circular, polygonal, or a shape with curved edges, or other suitable shapes. The electronic device may have a peripheral system such as a driving system, a control system, a light source system, a shelf system, etc., to support a display device, an antenna device, or a splicing device. Hereinafter, an electronic device with a display function is used to describe the content of the disclosure, but the disclosure is not limited thereto.

In the disclosure, the various embodiments described below may be mixed and combined without departing from the spirit and scope of the disclosure. For instance, part of the features of one embodiment may be combined with part of the features of another embodiment to form another embodiment.

Descriptions of the disclosure are given with reference to the exemplary embodiments illustrated by the accompanying drawings. Wherever possible, the same reference numbers are used in the drawings and the description to refer to the same or like parts.

Figure 2:
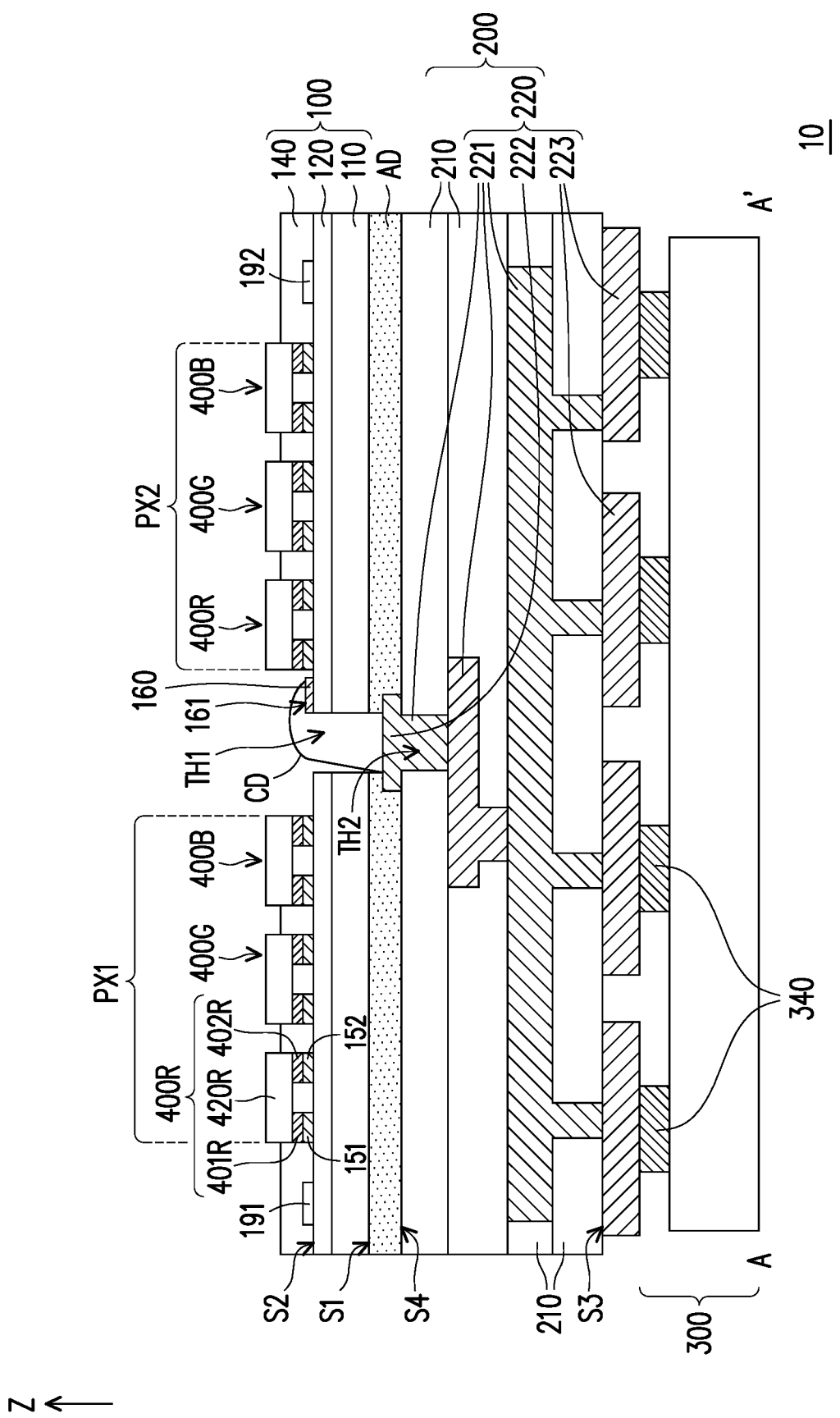
FIG. 2 is a schematic cross-sectional view of the electronic device of FIG. 1 taken along a cross-sectional line A-A'.

FIG. 1 is a schematic top view of an electronic device according to an embodiment of the disclosure, and for clarity of the accompanying drawing and convenience of description, several elements are omitted in FIG. 1. FIG. 2 is a schematic cross-sectional view of the electronic device of FIG. 1 taken along a cross-sectional line A-A', and for clarity of the accompanying drawing and convenience of description, several elements are omitted in FIG. 2. With reference to FIG. 1 and FIG. 2, in the embodiments of the disclosure, an electronic device 10 includes a substrate 100, a first conductive element 160, a second conductive element 220, and a conductor CD. The substrate 100 has at least one or a plurality of through holes TH1. The first conductive element 160 is disposed on the substrate 100. In some embodiments, the electronic device 10 further includes an electronic component 300 disposed below a circuit substrate 200, and the circuit substrate 200 is disposed below the substrate 100. The circuit substrate 200 has a second conductive element 220. The second conductive element 220 is disposed between the electronic component 300 and the substrate 100. The second conductive element 220 is, for example, a bonding pad or an interconnection layer (e.g., a patterned conductive layer) of the circuit substrate 200, but is not limited thereto. In a normal direction (or the Z axis) of the substrate 100, the through hole TH1 is disposed between the first conductive element 160 and the second conductive element 220. The conductor CD is at least partially disposed in the corresponding through hole TH1, and the conductor CD electrically connects the first conductive element 160 to the second conductive element 220 through the through hole TH1. In some embodiments, the electronic device 10 further includes a plurality of LEDs 400R, 400G, and 400B. In the foregoing configuration, the electronic device 10 may form a conductive path through the conductor CD and the second conductive element 220 and then electrically connects the electronic component 300 to the first conductive element 160 and the LEDs 400R, 400G, and 400B on the substrate 100 through the second conductive element 220. In this way, the LEDs 400R, 400G, and 400B may be driven to generate an image pattern. In addition, the conductor CD disposed in the through hole TH1 of the substrate 100 may achieve good electrical quality together with the electronic component 300, and the electrical quality of the electronic device 10 is thereby improved. Besides, the through hole TH1 allows the electronic component 300 to be disposed below the substrate 100 (for example, may be disposed on a back side of the substrate 100), and in this way, a peripheral usage rate of the electronic device 10 is lowered, a technical requirement of a narrow frame is further achieved, and good display quality is provided.

With reference to FIG. 1 and FIG. 2, the electronic device 10 is, for example, a LED display device. As shown in FIG. 1, in the normal direction (or the Z axis) of the substrate 100, a plurality of pixels PX1, PX2, PX3, and PX4 may be disposed on the substrate 100. In the embodiments of the disclosure, each of the pixels may include a plurality of LEDs, (e.g., the LED 400R, the LED 400G, and the LED 400B), and a number of the LEDs is not particularly limited. The four pixels PX1, PX2, PX3, and PX4 shown in FIG. 1 may be arranged in an array on an X axis and an Y axis (the X axis is perpendicular to the Y axis and the Z axis, and the Y axis is perpendicular to the X axis and the Z axis, but are not limited thereto), but are not limited thereto. Note that the number of pixels and the pattern of the arrangement shown in FIG. 1 are schematic only. The actual number of pixels may be tens, tens of thousands, or millions or more, but it is not limited thereto.

The substrate 100 of the electronic device 10 is, for example, an active array substrate, and includes a substrate base 110 and a circuit component layer 120 disposed on the substrate base 110. The substrate base 110 includes a rigid substrate, a flexible substrate, or a combination of the foregoing. For instance, the substrate base 110 includes, but not limited to, glass, quartz, sapphire, acrylic resin, polycarbonate (PC), polyimide (PI), polyethylene terephthalate (PET), other suitable transparent materials, or a combination of the foregoing materials. In some embodiments, a shape of the substrate 100 on the normal line (i.e., the Z axis) may be rectangular, polygonal, circular, or irregular, which is not particularly limited by the disclosure.

The circuit component layer 120 includes, but not limited to, a stacked structure of at least one or more circuit components (not shown in FIG. 1 and FIG. 2, such as a circuit component TFT1 shown in FIG. 6), a buffer layer, and a plurality of insulating layers, for example. In some embodiments, the circuit component layer 120 is, for example, an active array layer formed by a plurality of thin film transistors, but is not limited thereto. A detailed structure of the circuit component layer 120 is described later in FIG. 6.

A plurality of LEDs may be disposed in each pixel. For instance, in pixel PX1, the LEDs 400R, 400G, and 400B are disposed on the circuit component layer 120, but is not limited thereto. In some embodiments, the LEDs may include a red LED, a green LED, a blue LED, a white LED, a yellow LED, or LEDs of other colors, which may be adjusted according to design needs. In some embodiments, each LED includes electrodes and a crystal. Taking the LED 400R as an example, the LED 400R includes an electrode 401R, an electrode 402R, and a crystal 420R. The crystal 420R includes, for example, a first-type semiconductor layer (e.g., n-type doped semiconductor layer), a second-type semiconductor layer (e.g., p-type doped semiconductor layer), and a light emitting layer located between the first-type semiconductor layer and the second-type semiconductor layer. In other words, the crystal 420R may be a PN LED, but is not limited thereto. In this embodiment, the LEDs 400R, 400G, and 400B may be, for example, flip chip LEDs, but are not limited thereto. In other embodiments, the LEDs 400R, 400G, and 400B include vertical LEDs, formal LEDs, or other suitable types of LED packages.

The LEDs 400R, 400G, and 400B are electrically connected to the circuit component layer 120 of the substrate 100. For instance, the circuit component layer 120 is provided with a plurality of first bonding pads 151 and a plurality of second bonding pads 152. One of the plurality of LEDs is disposed corresponding to the first bonding pad 151 and the adjacent second bonding pad 152. For instance, the electrode 401R of the LED 400R may be electrically connected to the first bonding pad 151, and the electrode 402R may be electrically connected to the second bonding pad 152, but the disclosure is not limited thereto. In other embodiments, the electrode 401R may be electrically connected to the second bonding pad 152, and the electrode 402R may be electrically connected to the first bonding pad 151. In this way, the first bonding pad 151 and the second bonding pad 152 may be respectively applied to be bonding pads connected to an anode or a cathode of the LED 400R. In FIG. 2, in an embodiment of the disclosure, the LEDs 400R, 400G, and 400B are, for example, flip chips, but are not limited thereto. In other embodiments, the LEDs 400R, 400G, and 400B may be formal chips or other suitable structures. For instance, the LEDs 400R, 400G, and 400B may be electrically connected to the first bonding pads 151 and the second bonding pads 152 through wire bonding. In addition, in some other embodiments, through a transfer layer including a conductive circuit and an insulating layer, the LED 400R may also allow the electrode 401R or the electrode 402R to be electrically connected to the circuit components (e.g., the thin film transistors) in the circuit component layer 120 or a circuit layer through the conductive circuit, but is not limited thereto.

In some embodiments, the electronic device 10 may selectively include a first testing pad 191 and a plurality of second testing pads 192. Each of the first testing pad 191 and the second testing pads 192 may be disposed to be adjacent to one side of each of the pixels (e.g., pixel PX1), but is not limited thereto. The first testing pad 191 and the second testing pads 192 may be electrically connected to the circuit component layer 120, but are not limited thereto. The first testing pad 191 may be connected to the first bonding pads 151 in series. The second testing pads 192 may be electrically connected to the second bonding pads 152. In some embodiments, the first testing pad 191 and the second testing pads 192 may be applied as testing electrodes to be configured to detect electrical quality of the LEDs 400R, 400G, and 400B in the pixel PX1. In this embodiment, the LEDs 400R, 400G, and 400B in the pixel PX1 may be applied as sub-pixels, and a combination of the pixels PX1, PX2, PX3, and PX4 may be configured to generate an image pattern. In some embodiments, a number of the LEDs in the pixel PX1 may be three or greater, and included colors may include red light, blue light, green light, white light, yellow light, or other suitable colors of light, but the disclosure is not limited thereto.

Material of the first testing pad 191, the second testing pads 192, the first bonding pads 151, and the second testing pads 152 may include, but not limited to, molybdenum (Mo), titanium (Ti), tantalum (Ta), niobium (Nb), hafnium (HO, nickel (Ni), chromium (Cr), cobalt (Co), zirconium (Zr), tungsten (W), aluminum (Al), copper (Cu), silver (Ag), aurum (Au), other suitable metal, or an alloy or a combination of the foregoing materials. The materials of the first testing pad 191, the second testing pads 192, the first bonding pads 151, and the second bonding pads 152 may also include but not limited to a transparent conductive material or a non-transparent conductive material such as indium tin oxide, indium zinc oxide, indium oxide, zinc oxide, tin oxide, a metal material (e.g., aluminum, molybdenum, copper, silver, etc.), other suitable materials, or a combination of the foregoing materials.

The substrate 100 further includes an insulating layer 140 disposed on the circuit component layer 120. The insulating layer 140 includes, for example, a plurality of openings (not shown). The first bonding pads 151 and the adjacent second bonding pads 152 are disposed in the openings, and the LEDs 400R, 400G, and 400B may be electrically connected to the first bonding pads 151 and the second bonding pads 152 in the openings, but are not limited thereto. A material of the insulating layer 140 may be a single-layer structure or a multi-layer structure and may include, for example, an organic material (e.g., silicon nitride, etc.), an inorganic material, or a combination of the foregoing, but is not limited thereto. In some embodiments, the insulating layer 140 is, for example, epoxy resin, but is not limited thereto.

In some embodiments, the circuit substrate 200 is disposed below the substrate 100, and the circuit substrate 200 and the LEDs 400R, 400G, and 400B are respectively located on two opposite surfaces (e.g., a lower surface S1 and an upper surface S2) of the substrate 100. For instance, the circuit substrate 200 is disposed on the lower surface S1 of the substrate 100. The LEDs 400R, 400G, and 400B are disposed on the upper surface S2 of the substrate 100. The circuit substrate 200 is, for example, a printed circuit board (PCB). In some other embodiments, the circuit substrate 200 may include, but not limited to, a chip on film (COF).

The circuit substrate 200 is a circuit board including a plurality of layers of insulating layers and an interconnection layer (e.g., a patterned conductive layer), for example. For instance, the circuit substrate 200 in an embodiment of the disclosure may be a printed circuit board (PCB) or a redistribution layer (RDL), but is not limited thereto. In other embodiments, the circuit substrate 200 may be an interposer. In some embodiments, the circuit substrate 200 includes a plurality of layers of insulating layers 210 stacked in the normal direction (i.e., the Z axis) of the substrate 100 and the second conductive element 220 disposed in the layers of the insulating layers 210. In some embodiments, a material of the insulating layers 210 includes, but not limited to, prepreg, a photoimageable dielectric (PID) material, a photosensitive polymer (e.g., benzocyclobutene), an ajinomoto build-up film, resin coated cooper foil (RCC), flame-resistant glass fiber (FR4), a glass fiber resin composite material or a combination thereof, or other suitable materials.

The second conductive element 220 is, for example, bonding pads 222 and 223 or an interconnection layer 221 (e.g., a patterned conductive layer) of the circuit substrate 200. For instance, the interconnection layer 221 of the second conductive element 220 may be multiple layers and may be stacked with the insulating layers 210 in an alternating manner. The interconnection layers 221 may be electrically connected to each other through a plurality of vias penetrating through the insulating layers 210. In some other embodiments, the second conductive element 220 may further include a bonding pad 222 disposed on an upper surface S4 of the insulating layers 210 and a bonding pad 223 disposed on a lower surface S3 of the insulating layers 210 (for example, the lower surface S3 is opposite to the upper surface S4). A material of the interconnection layers 221, the bonding pad 222, or the bonding pad 223 may be similar to the materials of the first testing pad 191, the second testing pads 192, the first bonding pads 151, and the second bonding pads 152, and repeated description is thus not provided herein.

The electronic component 300 is disposed below the circuit substrate 200 and is disposed in the normal direction (or the Z axis) of the substrate 100, and the circuit substrate 200 is located between the electronic component 300 and the substrate 100. The electronic component 300 is, for example, a chip and includes a plurality of bonding pads 340. The electronic component 300 is electrically connected to the bonding pad 223 of the circuit substrate 200 through the bonding pads 340, so as to provide a driving signal for driving the LEDs 400R, 400G, and 400B, but is not limited thereto.

In some embodiments, in the normal direction (or the Z axis) of the substrate 100, an adhesive layer AD may be selectively disposed between the substrate 100 and the circuit substrate 200. Further, a portion of the adhesive layer AD may be located between the substrate 100 and the second conductive element 220. The adhesive layer AD may include photo-curable glue, heat-curable glue, or other suitable adhesive materials.

The substrate 100 has a plurality of through holes TH1. For instance, the through holes TH1 may be disposed to be adjacent to the pixel PX1 (or any other pixels), or the through holes TH1 may be disposed between any adjacent two pixels (e.g., between the pixel PX1 and the pixel PX2), but are not limited thereto. In some other embodiments, the through holes TH1 may be disposed between any adjacent two LEDs, but are not limited thereto. The through holes TH1 penetrate through the substrate base 110 and the circuit component layer 120.

The circuit substrate 200 has through holes TH2. The through holes TH1 of the substrate 100 may overlap the through holes TH2 of the circuit substrate 200, but are not limited thereto. In some other embodiments, the through holes TH1 may partially overlap the through holes TH2, that is, the through holes TH1 and the through holes TH2 may be misaligned, but are not limited thereto. The second conductive element 220 located on the lower surface S3 of the substrate base 210 is electrically connected to the electronic component 300. In some embodiments, a portion of the second conductive element 220 on the upper surface S4 of the substrate base 210 may be located outside the through holes TH2 and may be located between the upper surface S4 of the circuit substrate 200 and the lower surface S1 of the substrate 100. As shown in FIG. 2, at least a portion of the second conductive element 220 may overlap the through holes TH1 in the normal direction (Z axis) of the substrate 100, but is not limited thereto.

Note that the circuit component layer 120 of the electronic device 10 may include the first conductive element 160, the first testing pad 191, the second testing pads 192, the first bonding pads 151, and the second bonding pads 152. For instance, in this embodiments, the first conductive element 160, the first testing pad 191, the second testing pads 192, the first bonding pads 151, and the second bonding pads 152 are disposed on a top insulating layer (e.g., the upper surface S2) of the circuit component layer 120 of the substrate 100. In other embodiments, the first conductive element 160, the first testing pad 191, the second testing pads 192, the first bonding pads 151, and/or the second bonding pads 152 may be selectively exposed by the top insulating layer in the circuit component layer (for example, the first conductive element 160, the first testing pad 191, the second testing pads 192, the first bonding pads 151, and the second bonding pads 152 at least partially overlap in an opening of the insulating layer). Note that upper surfaces of the first conductive element 160, the first testing pad 191, the second testing pads 192, the first bonding pads 151, or the second bonding pads 152 may be exposed by the insulating layer to be electrically connected to other elements. Arrangement of the first conductive element 160, the first testing pad 191, the second testing pads 192, the first bonding pads 151, or the second bonding pads 152 may be adjusted according to design and is not limited to a structural relationship shown in the content of the foregoing description or accompanying drawings. In some embodiments, the first conductive element 160, the first testing pad 191, the second testing pads 192, the first bonding pads 151, or the second bonding pads 152 may be formed by a same conductive material layer through patterning. In some embodiments, in the first conductive element 160, the first testing pad 191, the second testing pads 192, the first bonding pads 151, or the second bonding pads 152, the conductive layer or the interconnection layer (e.g., the patterned conductive layer) formed in the circuit component layer 120 may be disposed on the upper surface S2, but is not limited thereto. Alternatively, the first conductive element 160, the first testing pad 191, the second testing pads 192, the first bonding pads 151, or the second bonding pads 152 may be formed on the upper surface S2 by different conductive materials after patterning, but are not limited thereto. The first conductive element 160 may be electrically connected to the first testing pad 191, the second testing pads 192, the first bonding pads 151, or the second testing pads 152, but is not limited thereto.

As shown in FIG. 1 and FIG. 2, the through hole TH1 is partially surrounded by the first conductive element 160. In the embodiments of the disclosure, partially surrounding is defined as: surrounding the through hole TH1, but not forming a continuous and closed ring (for example, including a circular ring or a square ring, but not limited thereto). In some embodiments, a gap GP is disposed to be adjacent to the first conductive element 160 and the through hole TH1. In some embodiments, the conductor CD may be at least partially filled in the through hole TH1 and may electrically connect the first conductive element 160 to the second conductive element 220 through the through hole TH1. A material of the conductor CD includes, but not limited to, a conductive material, silver paste, copper paste, conductive solder, or other suitable materials. In this way, the conductor CD of the electronic device 10 may be electrically connected to the second conductive element 220 and the electronic component 300 through the through hole TH1. In the foregoing arrangement, the driving signal of the electronic component 300 may be provided to the first conductive element 160 and the LEDs 400R, 400G, and 1400B through the conductive path formed by the conductor CD and the second conductive element 220. In this way, when the electronic device 10 is applied to the field of display devices, the driving signal of the electronic component 300 may be transmitted from one surface of the substrate 100 to the LEDs 400R, 400G, and 400B on the other surface through the conductor CD in the through hole TH1. As such, the electronic component 300 may be disposed below the substrate 100 (for example, may be disposed on the back side of the substrate 100), and the peripheral usage rate of the electronic device 10 is thereby lowered, and the technical requirement of a narrow frame is further achieved. In addition, the conductor CD disposed in the through hole TH1 of the substrate 100 may achieve good electrical quality together with the electronic component 300. Therefore, the electronic device 10 may exhibit good electrical quality or display quality.

FIG. 3A is a schematic enlargement top view of a first conductive element and a through hole of the electronic device according to an embodiment of the disclosure, and for clarity of the accompanying drawing and convenience of description, several elements are omitted in FIG. 3A. FIG. 3B is a schematic cross-sectional view of the electronic device of FIG. 3A taken along a cross-sectional line B-B', and for clarity of the accompanying drawing and convenience of description, several elements are omitted in FIG. 3B. The first conductive element 160 has a first region 161. The first region 161 is a portion of the first conductive element 160 covered by other conductive materials, for example. The through hole TH1 is partially surrounded by the first region 161 of the first conductive element 160. For instance, the first region 161 may be C-shaped on the Z axis, and the gap GP is adjacent to the through hole TH1 and the first conductive element 160. In other words, in the gap GP, the first conductive element 160 and the substrate 100 to not overlap.

Note that the conductor CD may fill a portion of the through hole TH1 or may fill up the through hole TH1, but is not limited thereto. For instance, in a process of filling the conductor CD into the through hole TH1, a side wall CD1 of the conductor CD in the through hole TH1 and a side wall 100S of the through hole TH1 may be separated by a space SP. To be specific, the conductor CD is disposed in the through hole TH1 through, for example, micro inkjet printing (MJP) chemical vapor deposition (CVD), physical vapor deposition, or electroplating, and the like. A portion of the conductor CD may be disposed on the first region 161 and directly contacts the first region 161, so that the conductor CD is disposed to partially surrounds the through hole TH1. In the foregoing arrangement, the conductor CD has the side wall CD1 in the through hole TH1. The through hole TH1 has the side wall 100S, and the space SP is provided between the side wall 100S and the side wall CD1 of the conductor CD. That is, in the step of filling in the conductor CD, the side wall CD1 of the conductor CD may partially not contact the side wall 100S of the through hole TH1 and/or a side wall ADS of the adhesive layer AD. In this way, during a manufacturing process of arranging the conductor CD in the through hole TH1, the generated air bubbles may be released through the space SP. Accordingly, the risk of generation of air bubbles in the conductor CD, which may lead to poor contact between the conductor CD and the second conductive element 220 and a problem of electrical abnormality, may be prevented from occurring. In some embodiments, the arrangement of the conductor CD may be continuously performed, so that the through hole TH1 is gradually filled with the conductor CD, and the air bubbles are released through the space SP. In this way, the conductor CD gradually fills up the through hole TH1 or partially overflows the through hole TH1, but is not limited thereto. In the foregoing arrangement, reliability of electrical connection of the electronic device 10 may be improved, and good electrical quality or display quality is provided.

With reference to FIG. 1 again, the electronic device 10 further includes a plurality of conductive elements with different patterns. For instance, a first conductive element 160A disposed to be adjacent to the pixel PX3 is located on one side of the through hole TH1, so that the through hole TH1 is partially surrounded. In the normal direction (i.e., the Z axis) of the substrate 100, the first conductive element 160A is, for example, a rectangular, elliptical, symmetrical, or irregular pattern and is disposed to be adjacent to the through hole TH1. In this way, the first conductive element 160A may provide favorable technical effects similar to that provided in the foregoing embodiments.

In some embodiments, the electronic device 10 has first conductive elements 160B disposed between the pixel PX3 and the pixel PX4. The first conductive elements 160B may also be disposed between the LEDs of adjacent two pixels, and arrangement thereof is not limited to what is shown in FIG. 1. The two first conductive elements 160B are disposed on one side and the opposite side of the through hole TH1. That is, the through hole TH1 is located between two first conductive elements 160B opposite to each other, so that the through hole TH1 is partially surrounded by two first conductive elements 160B. In the normal direction (i.e., the Z axis) of the substrate 100, each of the first conductive elements 160B is, for example, a rectangular, elliptical, symmetrical, or irregular pattern. In this way, the first conductive elements 160B may provide favorable technical effects similar to that provided in the foregoing embodiments.

In some embodiments, the electronic device 10 has first conductive elements 160C and 160C' disposed to be adjacent to the pixel PX4. The first conductive elements 160C and 160C' are disposed on four sides of the through hole TH1, so that the through hole TH1 is partially surrounded. For instance, two first conductive elements 160C are disposed on two opposite sides of the through hole TH1. Two first conductive elements 160C' are disposed on the other two opposite sides of the through hole TH1. In this way, the through hole TH1 is disposed between the first conductive elements 160C or between the first conductive elements 160C'. In the normal direction (i.e., the Z axis) of the substrate 100, each of the first conductive elements 160C and the first conductive elements 160C' is, for example, a rectangular, elliptical, symmetrical, or irregular pattern. In some embodiments, the first conductive elements 160C and the first conductive elements 160C' are discontinuous patterns, and the gap GP is provided between the first conductive elements 160C and the first conductive elements 160C'. Therefore, the through hole TH1 is partially surrounded by the first conductive elements 160C and the first conductive elements 160C'. In this way, the first conductive elements 160C and the first conductive elements 160C' may provide favorable technical effects similar to that provided in the foregoing embodiments.

Other embodiments are described for illustration in the following. It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiments for the omitted contents, which will not be repeated hereinafter.

FIG. 4A is a schematic enlargement top view of a first conductive element and a through hole of an electronic device according to another embodiment of the disclosure, and for clarity of the accompanying drawing and convenience of description, several elements are omitted in FIG. 4A. FIG. 4B is a schematic cross-sectional view of the electronic device of FIG. 4A taken along a cross-sectional line C-C', and for clarity of the accompanying drawing and convenience of description, several elements are omitted in FIG. 4B. An electronic device 10A provided in this embodiment is approximately similar to the electronic device 10 in FIG. 3A, so that description of identical or similar components in the two embodiments is not repeated. A difference between this embodiment and the electronic device 10 is that a first conductive element 160D further includes a second region 162. The second region 162 is a portion of the first conductive element 160 covered by other non-conductive materials, for example. In some embodiments, the first conductive element 160D is disposed to surround the through hole TH1. A portion of the through hole TH1 is partially surrounded by the first region 161, another portion of the through hole TH1 is partially surrounded by the second region 162, and the first region 161 may be connected to the second region 162. In this way, the first conductive element 160D may continuously surround the through hole TH1, but is not limited thereto.

The electronic device 10A further includes an insulating element ILL The insulating element IL1 is correspondingly disposed on the second region 162. In some embodiments, the insulating element IL1 overlaps the second region 162 in the normal direction (i.e., the Z axis) of the substrate 100, but is not limited thereto. The insulating element IL1 may be directly formed on the second region 162. Alternatively, the insulating element IL1 may be formed first on the first conductive element 160 through an insulating material and is then formed on the second region 162 through a patterning process, but is not limited thereto.

In the foregoing arrangement, during the manufacturing process of arranging the conductor CD in the through hole TH1, a portion of the conductor CD may directly contact the first region 161 and fills into a portion of the through hole TH1. The through hole TH1 has the side wall 100S, and the space SP is provided between the side wall 100S and the side wall CD1 of the conductor CD. That is, the conductor CD and the second region 162 are separated by the space SP. Alternatively, the conductor CD and the insulating element IL1 are separated by the space SP. The side wall CD1 of the conductor CD does not contact the side wall 100S. In other embodiments, after the step of filling the conductor CD in the through hole TH1 is completed, the conductor D may fill up the through hole TH1, but is not limited thereto. In this way, during the manufacturing process of arranging the conductor CD, the generated air bubbles may be released through the space SP. Accordingly, the problem of electrical abnormality caused by poor contact between the conductor CD and the second conductive element 220 may be alleviated. Therefore, reliability of electrical connection of the electronic device 10A may be improved, and good electrical quality or display quality is provided. Besides, the electronic device 110A may further obtain favorable technical effects similar to that provided in the foregoing embodiments.

Figure 5:
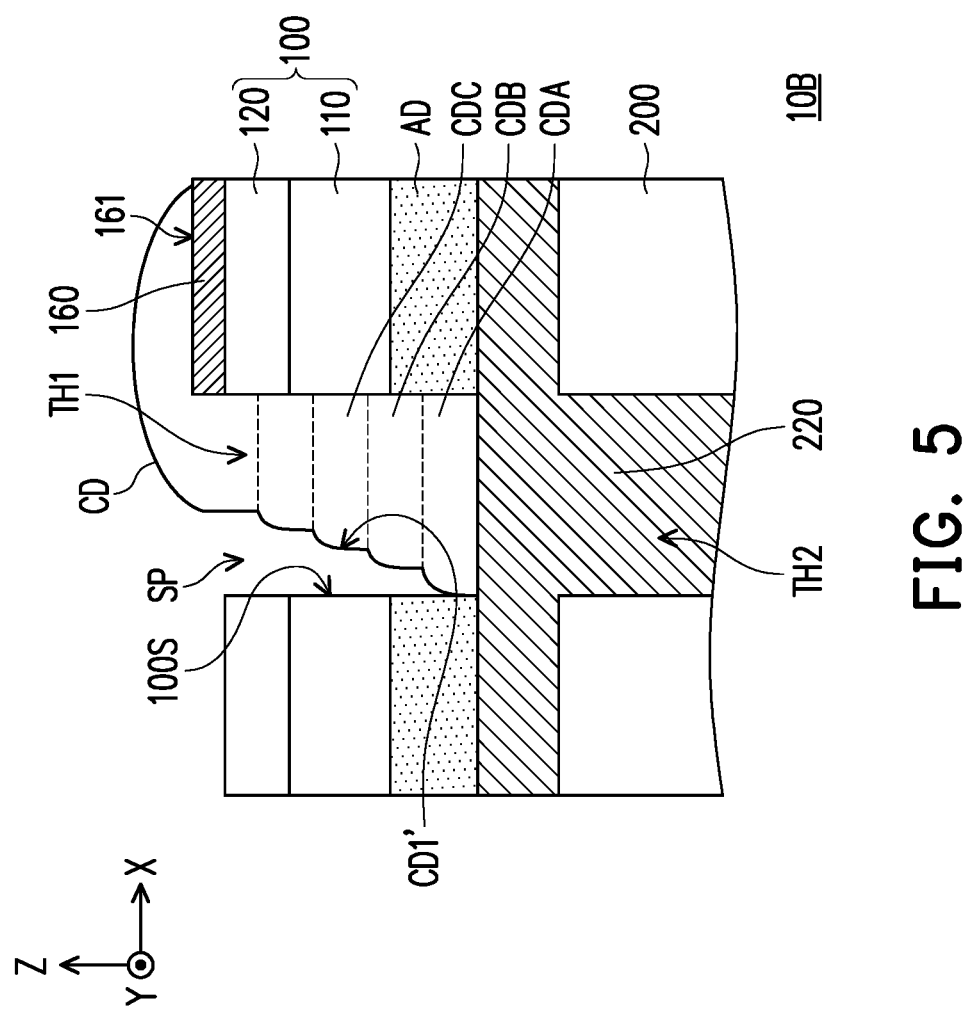
FIG. 5 is a schematic cross-sectional view of an electronic device according to another embodiment of the disclosure.

FIG. 5 is a schematic cross-sectional view of an electronic device according to another embodiment of the disclosure, and for clarity of the accompanying drawing and convenience of description, several elements are omitted in FIG. 5. An electronic device 10B provided in this embodiment is approximately similar to the electronic device 10 in FIG. 3B, so that description of identical or similar components in the two embodiments is not repeated. A difference between this embodiment and the electronic device 10 is that at least a portion of the conductor CD filling in the through hole TH1 is formed by stacking multiple layers of conductive materials. For instance, during the manufacturing process of arranging the conductor CD in the through hole TH1, regarding the conductor CD, the conductive materials may be arranged as a plurality of conductive layers stacked in the through hole TH1 through a plurality of deposition processes or electroplating processes performed in sequence. To be specific, a first conductive layer CDA may be disposed in the through hole TH1 first. Next, in the through hole TH1, a second conductive layer CDB may be disposed on the first conductive layer CDA. A volume of the second conductive layer CDB may be less than that of the first conductive layer CDA. A third conductive layer CDC may then be disposed on the second conductive layer CDB in sequence, and a volume of the third conductive layer CDC may be less than that of the second conductive layer CDB to form the stepped conductor CD. An uppermost conductive layer of the conductor CD directly contacts the first region 161 and partially fills the through hole TH1. In FIG. 5, between the first conductive layer CDA and the second conductive layer CDB or between the second conductive layer CDB and the third conductive layer CDC, a dashed line is used to indicate a layered and stacked structure. However, in fact, after the manufacturing process of the conductor CD is completed, the first conductive layer CDA, the second conductive layer CDB, the third conductive layer CDC and other conductive layers may be stacked to form an integral conductor CD, but is not limited thereto. In this way, the conductor CD may have a stepped side wall CD1'.

In the foregoing arrangement, the space SP is provided between the stepped side wall CD1' and the side wall 100S of the through hole TH1. That is, the side wall CD1' of the conductor CD does not contact the side wall 100S. In this way, during the manufacturing process of arranging the conductor CD, the generated air bubbles may be released through the space SP. Besides, through the conductor CD formed by stacking of multiple layers of conductive materials through deposition processes or electroplating processes performed in sequence, generation of the air bubbles may be reduced or the air bubbles may be released from the space SP. Accordingly, the problem of electrical abnormality caused by poor contact between the conductor CD and the second conductive element 220 may be alleviated. Therefore, reliability of electrical connection of the electronic device 10B may be improved, and good electrical quality or display quality is provided. Besides, the electronic device 110A may further obtain favorable technical effects similar to that provided in the foregoing embodiments.

Figure 6:
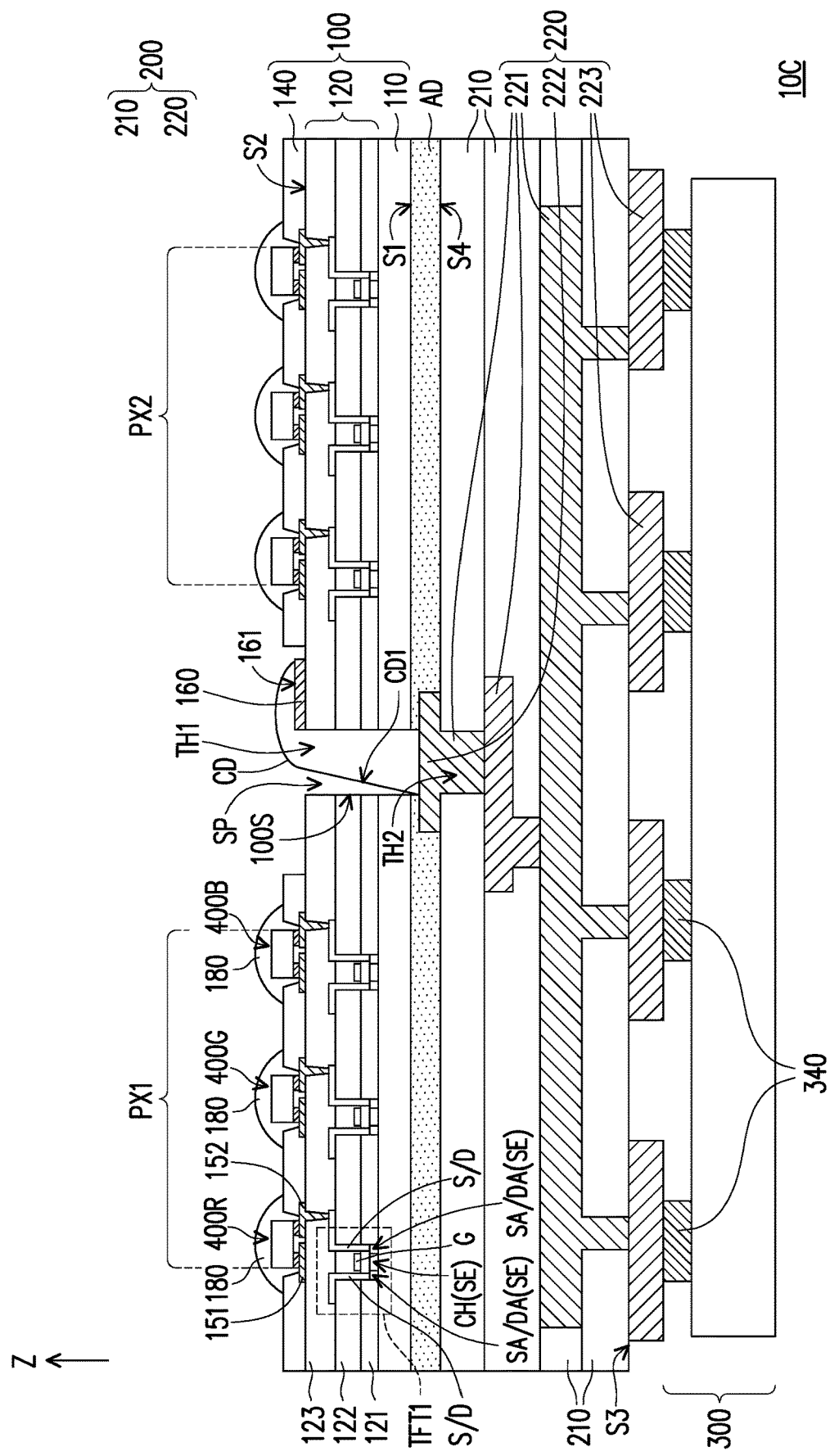
FIG. 6 is a schematic cross-sectional view of an electronic device according to another embodiment of the disclosure.

FIG. 6 is a schematic cross-sectional view of an electronic device according to another embodiment of the disclosure, and for clarity of the accompanying drawing and convenience of description, several elements are omitted in FIG. 6. An electronic device 10C provided in this embodiment is approximately similar to the electronic device 10 in FIG. 2, so that description of identical or similar components in the two embodiments is not repeated. With reference to FIG. 2 and FIG. 6 together, a structure of the circuit component layer 120 is depicted in FIG. 6. For instance, the circuit component layer 120 includes a plurality of circuit components TFT1 and a plurality of insulating layers. Hereinafter, the method of the manufacturing process is briefly described with the electronic device 10C shown in FIG. 6.

First, the substrate base 110 is provided.

Next, the circuit component layer 120 is disposed on the substrate base 110. The circuit component layer 120 includes, for example, a gate insulating layer 121, an insulating layer 122, and an insulating layer 123 disposed on the substrate base 110 on the Z in sequence. The circuit components TFT1 are disposed in the gate insulating layer 121, the insulating layer 122, and the insulating layer 123, but is not limited thereto. In some embodiments, the circuit component layer 120 may selectively include a buffer layer (not shown), and the buffer layer may be disposed between the substrate base 110 and the gate insulating layer 121, but is not limited thereto. The gate insulating layer 121, the insulating layer 122, and the insulating layer 123 may have a single-layer or multi-layer structure, but are not limited thereto.

During the process of arranging the circuit component layer 120, generation of the circuit components TFT1 is included. The circuit components TFT1 are, for example, thin film transistors (TFTs). Each of the circuit components TFT1 includes a gate G, a semiconductor layer SE, a source S, and a drain D. In some embodiments, during the forming process of the circuit components TFT1, the semiconductor layer SE is disposed on the substrate base 110 or the buffer layer. Next, a doping process is performed to the semiconductor layer SE to form a source region SA or a drain region DA. Next, the gate insulating layer 121 is formed on the semiconductor layer SE. Next, the gate G is formed on the gate insulating layer 121. The semiconductor layer SE further includes a channel region CH located between the source region SA and the drain region DA, and in the normal direction of the substrate 100, the channel region CH overlaps the gate G. Next, the insulating layer 122 is formed on the gate G. A plurality of through holes are then formed between the gate insulating layer 121 and the insulating layer 122, so as to form the source S and the drain D in the through holes. The source S is electrically connected to the source region SA, and the drain D is electrically connected to the drain region DA, but is not limited thereto. In some embodiments, arrangements of the source S, the drain D, the drain region DA, and the source region SA are interchangeable and may be determined according to design needs. The source S and a portion of the drain D are located on the insulating layer 122. Next, the insulating layer 123 is formed on the insulating layer 122 and covers the source S and the drain D. Arrangement of the circuit components TFT1 is completed so far. Materials of the gate G, the source S, and the drain D may include, but not limited to, tantalum (Ta), niobium (Nb), hafnium (Hf), nickel (Ni), chromium (Cr), cobalt (Co), zirconium (Zr), tungsten (W), aluminum (Al), silver (Ag), aurum (Au), other suitable metal, or an alloy or a combination of the foregoing materials. A material of the semiconductor layer SE is, for example, low temperature polysilicon (LTPS) or low temperature polysilicon oxide (LTPO), but is not limited thereto. In some other embodiments of the disclosure, the material of the semiconductor layer SE may include, but not limited to, amorphous silicon (a-Si). In this embodiment, each of the circuit components TFT1 is, for example, a top gate thin film transistor, but is not limited thereto. In some other embodiments, each of the circuit components TFT1 may also be a bottom gate thin film transistor or a double-gate or dual-gate thin film transistor.

Next, a conductive via is formed in the insulating layer 123, and the first bonding pads 151 and the second bonding pads 152 are formed on an upper surface of the insulating layer 123. The first bonding pads 151 or the second bonding pads 152 may be electrically connected to the circuit components TFT1, and the first conductive element 160 may be electrically connected to the circuit components TFT1, but is not limited thereto.

Next, an insulating layer 140 is formed on the insulating layer 123. The insulating layer 140 may be patterned to form a plurality of openings, and the first bonding pads 151 and the second bonding pads 152 may be located in the openings.

In this embodiment, in the step of forming the first bonding pads 151 and the second bonding pads 152, the first conductive element 160 may be formed together on the upper surface of the insulating layer 123, but is not limited thereto. The first conductive element 160 may also be disposed after the through hole TH1 is subsequently formed. In some embodiments, the circuit components TFT1 in the circuit component layer 120 may be electrically connected to the first conductive element 160, but are not limited thereto.

Next, the adhesive layer AD is formed on the lower surface S1 of the substrate base 110.

The lower surface S1 of the substrate 100 is bonded to the upper surface S4 of the circuit substrate 200 through the adhesive layer AD. The circuit substrate 200 includes the through hole TH2 and the second conductive element 220. Portions of the second conductive element 220 are disposed on the upper surface S4 and the lower surface S3 of the circuit substrate 200, and another portion of the second conductive element 220 is disposed in the through hole TH2. An electrode 340 of the electronic component 300 is electrically connected to the second conductive element 220 located on the lower surface S3. In the foregoing arrangement, the second conductive element 220 is disposed between the electronic component 300 and the substrate 100.

A drilling process is then performed to the substrate 100 to form the through hole TH1. The drilling process includes, but not limited to, a laser drilling process or a mechanical drilling process, for example. The through hole TH1 penetrates through the circuit component layer 120 and the substrate base 110, and the through hole TH1 corresponds to the through hole TH2, but is not limited thereto. In some embodiments, the through hole TH1 may overlap the portion of the second conductive element 220 located on the upper surface S4, but is not limited thereto.

Next, the conductor CD is formed. The conductor CD directly contacts the first region 161 of the first conductive element 160 and fills a portion of the through hole TH1 to contact the second conductive element 220. The side wall CD1 of the conductor CD and the side wall 100S of the through hole TH1 is separated by the space SP. In some other embodiments, after the step of filling the conductor CD in the through hole TH1 is completed, the conductor D may fill up the through hole TH1, but is not limited thereto.

The LEDs 400R, 400G, and 400B are then disposed in the openings of the insulating layer 140. The LEDs 400R, 400G, and 400B are electrically connected to the corresponding first bonding pads 151 and the second bonding pads 152 respectively. The LEDs 400R, 400G, and 400B may include millimeter/sub-millimeter LEDs (mini LEDs), micro LEDs, or quantum dot (QD) LEDs. In some other embodiments, the LEDs 400R, 400G, and 400B may also include, but not limited to, organic LEDs (OLEDs).

Next, a protective layer 180 is disposed on the insulating layer 140 and covers the LEDs 400R, 400G, and 400B. The protective layer 180 may have an optical function or a protective function, but is not limited thereto. For instance, the protective layer 180 may have an optical focusing function, a scattering function, or a lens function, but is not limited thereto. The protective layer 180 may protect the LEDs 400R, 400G, and 400B and may reduce damage to the LEDs 400R, 400G, and 400B caused by external moisture or oxygen. The manufacturing process of the electronic device 10C is generally completed so far.

Note that the steps of arranging the LEDs 400R, 400G, and 400B may be performed before the drilling process steps of forming the through hole TH1 or may be performed before the steps of forming the conductor CD, but are not limited thereto. The abovementioned manufacturing process sequence provided by the embodiments of the disclosure is intended to illustrate the relationship between the method and structure of the formation of each element in the electronic device 10C, and is not intended to limit the manufacturing sequence of the electronic device 10C.

In the foregoing arrangement, during the manufacturing process of arranging the conductor CD, the generated air bubbles may be released through the space SP. Accordingly, the problem of electrical abnormality caused by poor contact between the conductor CD and the second conductive element 220 may be alleviated. Therefore, reliability of electrical connection of the electronic device 10C may be improved, and good electrical quality or display quality is provided. Besides, the electronic device 110C may further obtain favorable technical effects similar to that provided in the foregoing embodiments.

Figure 7:
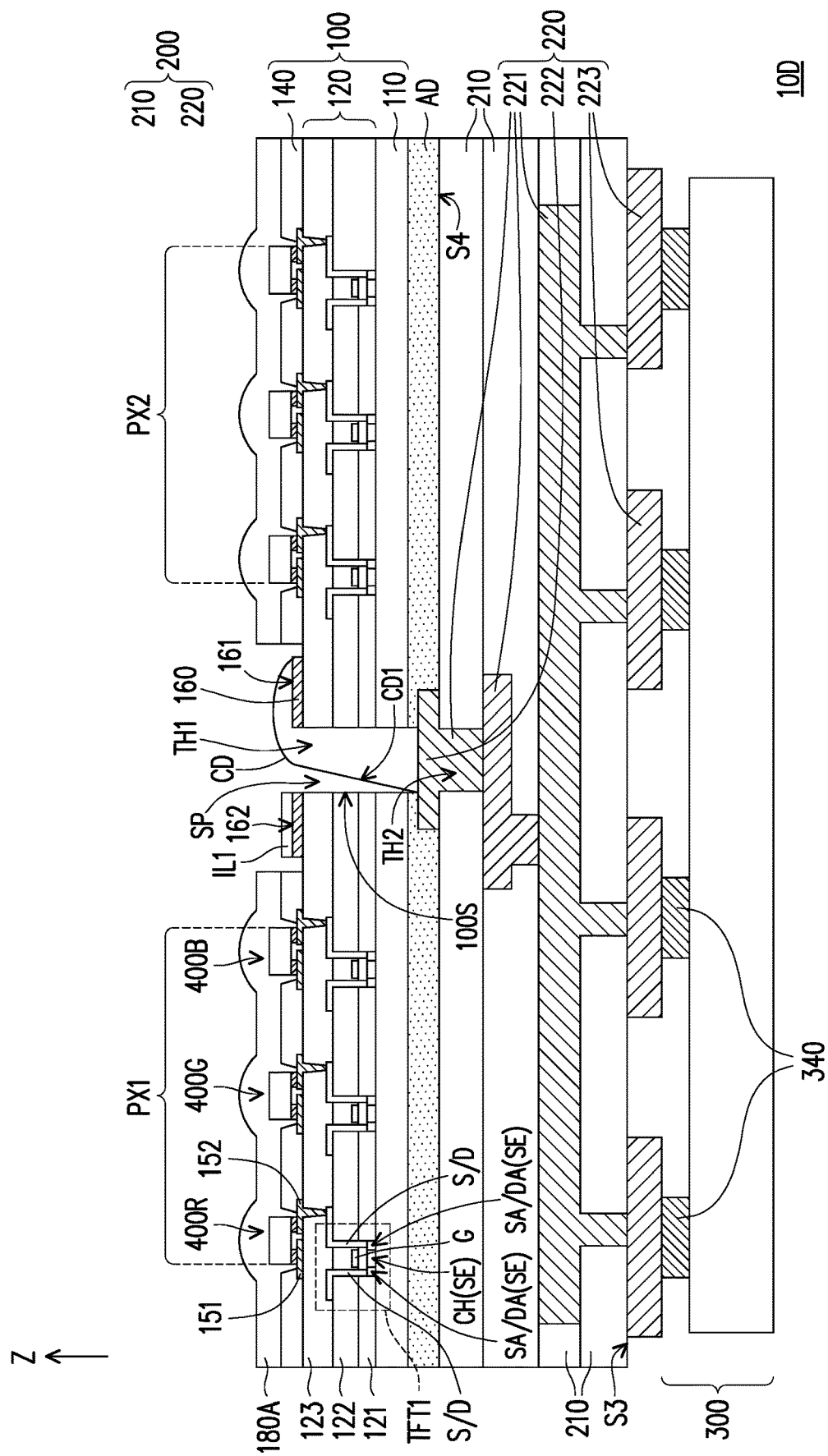
FIG. 7 is a schematic cross-sectional view of an electronic device according to still another embodiment of the disclosure.

FIG. 7 is a schematic cross-sectional view of an electronic device according to still another embodiment of the disclosure, and for clarity of the accompanying drawing and convenience of description, several elements are omitted in FIG. 7. An electronic device 10D provided in this embodiment is approximately similar to the electronic device 10C in FIG. 6, so that description of identical or similar components in the two embodiments is not repeated. A difference between this embodiment and the electronic device 10C is that a first conductive element 160D of the electronic device 10D has the first region 161 and the second region 162. A portion of the through hole TH1 is partially surrounded by the first region 161, another portion of the through hole TH1 is partially surrounded by the second region 162, and the first region 161 is connected to the second region 162.

The insulating element IL1 is correspondingly disposed on the second region 162. In some embodiments, the insulating element IL1 overlaps the second region 162 in the normal direction (i.e., the Z axis) of the substrate 100, but is not limited thereto. In some embodiments, regarding the insulating element IL1, in the step of forming the insulating layer 140, the material of the insulating layer 140 may be disposed on the second region 162 first, and the material of the insulating layer 140 may then be patterned into the insulating element IL1 in the subsequent patterning step. In some other embodiments, the insulating element IL1 may be directly formed on the second region 162 by deposition or other suitable methods before or after the step of forming the insulating layer 140, but is not limited thereto.

A portion of the conductor CD may directly contact the first region 161 and fills a portion of the through hole TH1. The conductor CD and the second region 162 are separated by the space SP. Alternatively, the conductor CD and the insulating element IL1 are separated by the space SP. The side wall CD1 of the conductor CD does not contact the side wall 100S. In other embodiments, after the step of filling the conductor CD in the through hole TH1 is completed, the conductor D may fill up the through hole TH1, but is not limited thereto. In this way, the problem of electrical abnormality caused by poor contact between the conductor CD and the second conductive element 220 may be alleviated. Therefore, reliability of electrical connection of the electronic device 10D may be improved, and good electrical quality or display quality is provided. Besides, the electronic device 110D may further obtain favorable technical effects similar to that provided in the foregoing embodiments.

In addition, a protective layer 180A of the electronic device 10D continuously covers the insulating layer 140 and covers the LEDs 400R, 400G, and 400B, for example. Accordingly, the protective layer 180A may protect the LEDs 400R, 400G, and 400B and may reduce damage to the LEDs 400R, 400G, and 400B caused by external moisture or oxygen.

Figure 8:
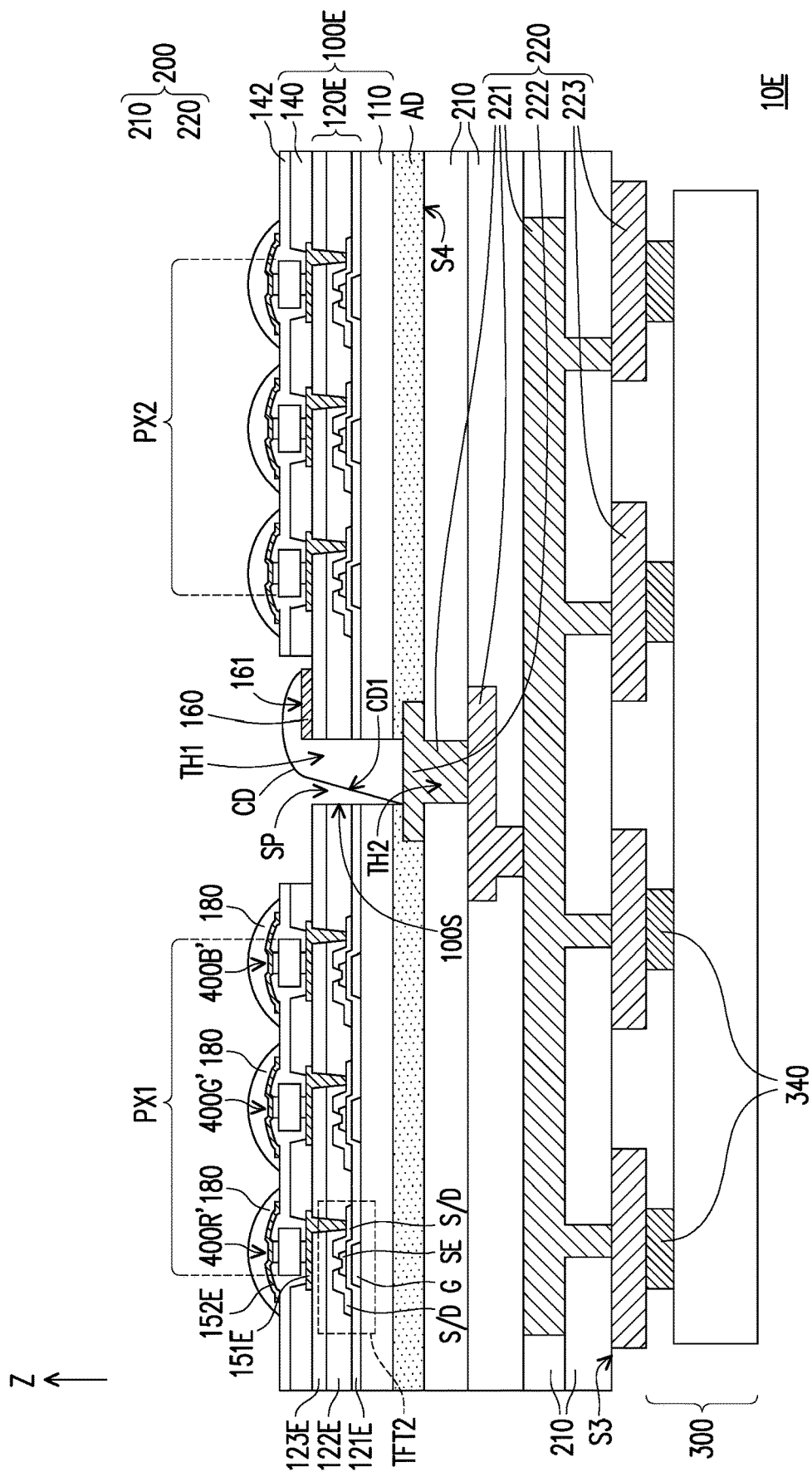
FIG. 8 is a schematic cross-sectional view of an electronic device according to yet another embodiment of the disclosure.

FIG. 8 is a schematic cross-sectional view of an electronic device according to yet another embodiment of the disclosure, and for clarity of the accompanying drawing and convenience of description, several elements are omitted in FIG. 8. An electronic device 10E provided in this embodiment is approximately similar to the electronic device 10C in FIG. 6, so that description of identical or similar components in the two embodiments is not repeated. A difference between this embodiment and the electronic device 10C is that a circuit component TFT2 in a circuit component layer 120E of a substrate 100E is, for example, a bottom-gate indium gallium zinc oxide (IGZO) thin film transistor. In addition, LEDs 400R', 400G', and 400B' are, for example, vertical LEDs.

To be specific, the substrate 100E includes the substrate base 110 and the circuit component layer 120E disposed on the substrate base 110. The circuit component layer 120E includes a gate insulating layer 121E, an insulating layer 122E, and an insulating layer 123E disposed on the substrate base 110 on the Z in sequence. The circuit component TFT2 is disposed in the gate insulating layer 121E, the insulating layer 122E, and the insulating layer 123E, but is not limited thereto. In some embodiments, the circuit component layer 120E may selectively include a buffer layer (not shown), and the buffer layer may be disposed between the substrate base 110 and the gate insulating layer 121E, but is not limited thereto. The gate insulating layer 121E, the insulating layer 122E, and the insulating layer 123E may have a single-layer or multi-layer structure, but are not limited thereto.

The circuit component TFT2 includes the gate G, the semiconductor layer SE, the source S, and the drain D. In some embodiments, during the forming process of the circuit component TFT2, the gate G is disposed on the substrate base 110 or the buffer layer. Next, the gate insulating layer 121E is formed on the gate G. The semiconductor layer SE is then formed on the gate insulating layer 121E and overlaps the gate G. Next, the source S and the drain D are formed on the gate insulating layer 121E. The source S and the drain D are electrically connected to the semiconductor layer SE. Next, the insulating layer 122E is formed on the semiconductor layer SE, the source S, and the drain D. The insulating layer 123E is then formed on the insulating layer 122E. Arrangement of the circuit component TFT2 is generally completed so far. The material of the semiconductor layer SE include, but not limited to, indium gallium zinc oxide (IGZO), for example. In other embodiments, the material of the semiconductor layer SE may include, but not limited to, amorphous silicon, polycrystalline silicon, and germanium; a compound semiconductor including gallium nitride (GaN), silicon carbide, gallium arsenide, gallium phosphide, indium phosphide, indium arsenide, and/or indium antimonide; and an alloy semiconductor including a SiGe alloy, GaAsP alloy, AlInAs alloy, AlGaAs alloy, GaInAs alloy, GaInP alloy, GaInAsP alloy, or a combination of the foregoing. The material of the semiconductor layer SE may also include, but not limited to, metal oxide such as indium gallium zinc oxide (IGZO), indium zinc oxide (IZO), indium gallium zinc oxide (IGZTO), or organic semiconductor containing polycyclic aromatic compounds, or a combination of the foregoing. In some embodiments, the semiconductor layer SE may be doped with a p-type or n-type dopant. In this embodiment, the circuit component TFT2 is, for example, a bottom gate thin film transistor, but is not limited thereto. In some other embodiments, the circuit component TFT2 may also be a top gate thin film transistor or a double-gate or dual-gate thin film transistor.

Next, a conductive via is formed in the insulating layer 122E and the insulating layer 123E, and first bonding pads 151E are formed on an upper surface of the insulating layer 123E. The first bonding pads 151E may be electrically connected to the circuit component TFT2.

The insulating layer 140 is then formed on the insulating layer 123E. The insulating layer 140 may be patterned to form a plurality of openings, and the first bonding pads 151E may be located in the openings.

Next, LEDs 400R', 400G', and 400B' are disposed on the first bonding pads 151E in the openings. Lower electrodes of the LEDs 400R', 400G', and 400B' are electrically connected to the first bonding pads 151E. In this embodiment, the LEDs 400R', 400G', and 400B' are vertical LEDs.

Next, the insulating layer 142 is disposed on the insulating layer 140. The insulating layer 142 covers portions of the LEDs 400R', 400G', and 400B' and exposes upper electrodes of the LEDs 400R', 400G', and 400B'. In some embodiments, the insulating layer 142 includes, but not limited to, an insulating material or a packaging material.

Next, second bonding pads 152E are disposed on the insulating layer 142. The second bonding pads 152E are electrically connected to the upper electrodes of the LEDs 400R', 400G', and 400B', and electrical connection of the LEDs 400R', 400G', and 400B' to the circuit component layer 120E is completed.

Next, the protective layer 180 is disposed on the insulating layer 142 and covers the LEDs 400R', 400G', and 400B'. The protective layer 180 may have an optical function or a protective function, but is not limited thereto. For instance, the protective layer 180 may have an optical focusing function, a scattering function, or a lens function, but is not limited thereto. The protective layer 180 may protect the LEDs 400R', 400G', and 400B' and may reduce damage to the LEDs 400R', 400G', and 400B'B caused by external moisture or oxygen.

In this embodiment, the electronic device 10E includes the through hole TH1 and the first conductive element, and the through hole TH1 is partially surrounded by the first region of the first conductive element 160. As such, during the manufacturing process of arranging the conductor CD, the generated air bubbles may be released through the space SP. Accordingly, the problem of electrical abnormality caused by poor contact between the conductor CD and the second conductive element 220 may be alleviated. Therefore, reliability of electrical connection of the electronic device 10E may be improved, and good electrical quality or display quality is provided. Besides, the electronic device 110E may further obtain favorable technical effects similar to that provided in the foregoing embodiments.

Note that as long as the elements in the above embodiments do not violate the inventive spirit of the disclosure, the elements may be mixed and matched for use. For instance, the electronic device 10D shown in FIG. 7 may be matched with the circuit component layer 120E shown in FIG. 8. As another example, the electronic device 10E shown in FIG. 8 may also be matched with the through hole TH1, the first conductive element 160, and the conductor CD shown in FIG. 5. In addition, the electronic device 10E shown in FIG. 8 may also use the continuously provided protective layer 180A shown in FIG. 7. The foregoing examples are intended to illustrate the various combinations and relationships of the elements shown in the embodiments of the disclosure, and are not intended to limit the number of structural combinations of the embodiments of the disclosure.

In view of the foregoing, in the electronic device provided in an embodiment of the disclosure, since the through hole is partially surrounded by the first region of the first conductive element, in the step of forming the conductor, the conductor only fills a portion of the through hole. The side wall of the conductor in the through hole and the side wall of the through hole is separated by the space. The side wall of the conductor does not contact the side wall of the through hole. In this way, during the step of forming the conductor, the generated air bubbles may be released through the space. Accordingly, the risk of generation of air bubbles in the conductor, which may lead to poor contact between the conductor and the second conductive element and the problem of electrical abnormality, may be prevented from occurring. Therefore, reliability of electrical connection of the electronic device may be improved, and that the electronic device may exhibit good electrical quality or display quality. In addition, the conductor of the electronic device may achieve good electrical quality together with the electronic component through the through hole. Further, the through hole disposed in the substrate may allow the electronic component to be disposed on the back side of the substrate, and in this way, the peripheral usage rate of the electronic device is lowered, the technical requirement of a narrow frame is further achieved, and good display quality is provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a first conductive element, having a first region and a second region;
   a second conductive element;
   a substrate, having a through hole, wherein the through hole is disposed between the first conductive element and the second conductive element;
   an insulating element, disposed on the second region and not disposed on the first region; and
   a conductor, wherein the conductor electrically connects the first conductive element to the second conductive element through the through hole,
   wherein the through hole is partially surrounded by the first region;
   wherein the second conductive element and the substrate are separated from each other; and
   wherein the conductor has a portion disposed on the first region and another portion connected with the portion, the another portion of the conductor extends into the through hole, and a side wall of the another portion of the conductor is separated from a side wall of the through hole.

2. The electronic device according to claim 1, wherein, the conductor directly contacts the first region.

3. The electronic device according to claim 1, wherein, the conductor and the second region are separated by a space.

4. The electronic device according to claim 1, wherein, the conductor is formed by stacking a plurality of layers of conductive materials.

5. The electronic device according to claim 1, further comprising a circuit component, wherein the circuit component is electrically connected to the first conductive element.

6. The electronic device according to claim 1, further comprising a circuit substrate, wherein the circuit substrate has the second conductive element.

7. The electronic device according to claim 6, further comprising an electronic component, wherein the electronic component is disposed below the circuit substrate, and the second conductive element is disposed between the electronic component and the substrate.

8. The electronic device according to claim 1, wherein, the electronic device is a light emitting diode display device.

9. The electronic device according to claim 1, further comprising an adhesive layer, wherein the adhesive layer is located between the substrate and the second conductive element, and the adhesive layer contacts a portion of the second conductive element.

10. The electronic device according to claim 1, wherein, a plurality of the first conductive elements are provided, and the through hole has one side and the other side opposite to each other, one of the first conductive elements is disposed on one side of the through hole, and another one of the first conductive elements is disposed on the other side of the through hole.

11. An electronic device, comprising:
    a first conductive element, having a first region and a second region;
    a second conductive element;
    a substrate, comprising:
      a first through hole, disposed between the first conductive element and the second conductive element; and
      a circuit component layer, comprising a plurality of circuit components, wherein the first through hole penetrates through the circuit component layer;
    an insulating element, disposed on the second region and not disposed on the first region;
    a conductor, wherein the conductor electrically connects the first conductive element to the second conductive element through the first through hole; and
    a plurality of light emitting diodes, disposed on the substrate, electrically connected to the circuit components and the first conductive element,
    wherein the first through hole is partially surrounded by the first region;
    wherein the second conductive element and the substrate are separated from each other; and
    wherein the conductor has a portion disposed on the first region and another portion connected with the portion, the another portion of the conductor extends into the first through hole, and a side wall of the another portion of the conductor is separated from a side wall of the first through hole.

12. The electronic device according to claim 11, further comprising a circuit substrate, wherein the substrate is disposed on the circuit substrate, and the circuit substrate has the second conductive element.

13. The electronic device according to claim 12, wherein, the circuit substrate has a second through hole, and the first through hole at least partially overlaps the second through hole.

14. The electronic device according to claim 13, wherein, a portion of the second conductive element is disposed in the second through hole, and an orthographic projection of the conductor on the circuit substrate partially overlaps an orthographic projection of the second through hole on the circuit substrate.

15. The electronic device according to claim 13, wherein, an orthographic projection of the first conductive element on the circuit substrate is located outside an orthographic projection of the second conductive element in the second through hole on the circuit substrate.

16. The electronic device according to claim 11, wherein, the conductor has a side surface, the side surface is an inclined surface, and the side surface is separated from the side wall of the first through hole.

17. The electronic device according to claim 11, wherein, the conductor has a side surface, the side surface extends from the second conductive element towards the first conductive element, and the side surface is gradually away from the side wall of the first through hole from the second conductive element towards the first conductive element.

18. The electronic device according to claim 11, wherein, the conductor has a side surface, and the side surface is stepped.

19. The electronic device according to claim 11, wherein a side surface of the conductor is separated from the insulating element on the second region.

* * * * *